United States Patent [19]

Ohigashi et al.

[11] Patent Number: 4,578,442

[45] Date of Patent: Mar. 25, 1986

[54] PIEZOELECTRIC POLYMERIC MATERIAL, A PROCESS FOR PRODUCING THE SAME AND AN ULTRASONIC TRANSDUCER UTILIZING THE SAME

[75] Inventors: Hiroji Ohigashi, Zushi; Keiko Koga, Sagamihara; Toshiharu Nakanishi, Kamakura, all of Japan

[73] Assignee: Toray Industries, Inc., Tokyo, Japan

[21] Appl. No.: 510,687

[22] Filed: Jul. 5, 1983

Related U.S. Application Data

[63] Continuation of Ser. No. 232,963, Feb. 9, 1981, abandoned.

[30] Foreign Application Priority Data

Feb. 7, 1980 [JP]  Japan ................................. 55-13839
Feb. 12, 1980 [JP] Japan ................................. 55-15860

[51] Int. Cl.$^4$ ...................... C04B 35/00; C08F 214/22
[52] U.S. Cl. ................................. 526/255; 252/62.9; 204/159.2; 264/22
[58] Field of Search ........................ 526/255; 264/22; 204/159.2; 252/62.9

[56] References Cited

U.S. PATENT DOCUMENTS

| | | | |
|---|---|---|---|
| 2,456,255 | 12/1948 | Coffman et al. | 526/255 |
| 3,803,108 | 4/1974 | Ocene | 526/255 |
| 3,878,274 | 4/1975 | Murayama et al. | 526/255 |
| 4,241,128 | 12/1980 | Wang | 526/255 |
| 4,265,841 | 5/1981 | Fujinori et al. | 264/22 |
| 4,268,653 | 5/1981 | Uchidoi et al. | 526/255 |
| 4,290,983 | 9/1981 | Sasaki et al. | 264/22 |
| 4,302,408 | 11/1981 | Ichihara | 264/22 |

*Primary Examiner*—Harry Wong, Jr.
*Attorney, Agent, or Firm*—Barnes & Thornburg

[57] ABSTRACT

A piezoelectric polymeric material having utility in ultrasonic transducers is disclosed which consists essentially of a copolymer of about 65 to 82 mol percent of vinylidene fluoride and about 35 to 18 mol percent of ethylene trifluoride. The polymeric material is formed into a film of the desired thickness and then heated to a temperature greater than about the crystal phase transition temperature and less than about the melting-point temperature to produce a heat-treated film. The heat-treated film is poled in an electrical field of from about 50 to about 1,500 kilovolts per centimeter to give the film a thickness extensional electromechanical coupling factor of at least 0.05 and preferably greater than 0.2.

11 Claims, 13 Drawing Figures

PIEZOELECTRIC POLYMERIC MATERIAL, A PROCESS FOR PRODUCING THE SAME AND AN ULTRASONIC TRANSDUCER UTILIZING THE SAME

This application is a continuation of application Ser. No. 232,963 filed Feb. 9, 1981, now abandoned.

BACKGROUND OF THE INVENTION

1. Field of the Invention

The present invention relates to a piezoelectric polymeric material consisting essentially of a copolymer of vinylidene fluoride and ethylene trifluoride and a process for producing the same in such a manner as to have a thickness extensional electromechanical coupling factor of at least 0.05, and further an ultrasonic transducer utilizing the same.

2. General Description of the Prior Art

It is well known that a polymer film may be made to be piezoelectric by having the film undergo an electrically polarizing (poling) treatment. Generally piezoelectric polymeric materials are preferred over inorganic single crystals or ceramic piezoelectric materials since piezoelectric polymeric materials not only have flexibility, and high water resistance and impact resistance, but their area and shape are not substantially restricted. Further, the acoustic impedance of a piezoelectric polymeric material is very close to those of water, plastics and living organisms. A piezoelectric polymeric material functioning as a transducer exhibits a low Q value upon transmission and reception of a sound wave to and from water, plastics, living organisms, etc. Therefore, as a broad band transducer piezoelectric polymeric materials are far superior to inorganic piezoelectric material for transducers for diagnosing the acoustic properties, especially the ultrasonic characteristics of substances such as plastics and living organisms.

One of the various factors indicating the performance of an ultrasonic transducer is the ratio of mechanical power output to electrical power input (or the ratio of electrical power output to mechanical power input) known as the electromechanical coupling factor. Of particular concern is the electromechanical coupling factor $K_t$ concerning thickness vibration.

The thickness extentional electromechanical coupling factor $K_t$ referred to herein is defined as follows:

$$K_t = \left[ \frac{e_{33}^2}{C_{33}^D \epsilon_{33}^S} \right]$$

wherein
$e_{33}$: Piezoelectric stress constant
$C_{33}^D$: Elastic constant under fixed electric displacement
$\epsilon_{33}^S$: Dielectric constant under fixed strain
Suffix letter: Z(3) axis is selected perpendicular to the film surface and letters are added thereto.

The value of the $K_t$ is measured by applying a high frequency (1–50 MHz) in AC field at room temperature to an about 1 cm² circular or square film and analyzing the frequency characteristics of an electric admittance Y in the vicinity of a resonance region of the film. As to the details, please refer to Journal of Applied Physics, Vol. 47, No. 3, March 1976, pages 949–955.

The terms transverse piezoelectric properties and thickness piezoelectric properties referred to herein are defined as follows. Namely, in a piezoelectric polymer film, the poling direction is perpendicular to the film surface and this direction is made the Z(3) axis. The axes of symmetry within the film surface are selected as the X(1) axis and the Y(2) axis. When the film is monoaxially drawn, this axis is made the X(1) axis. At this time, the components of the piezoelectric moduli or d-constants are as follows.

$$dij = \begin{bmatrix} 0 & 0 & 0 & 0 & d_{15} & 0 \\ 0 & 0 & 0 & d_{24} & 0 & 0 \\ d_{31} & d_{32} & d_{33} & 0 & 0 & 0 \end{bmatrix}$$

The piezoelectric constants shown by $d_{31}$ and $d_{32}$ are related to the transverse piezoelectric properties and the piezoelectric constant shown by $d_{33}$ is related to thickness piezoelectric properties. For information, it is most effective to use the piezoelectric properties in the vicinity of a frequency where this thickness expansion and contraction vibration is substantially in a resonance state under circumstances decided by the electric and acoustic properties of the film per se and the boundary conditions of the film. However, as occasion demands, it is possible to use the piezoelectric properties at a non-resonance frequency.

The value of the piezoelectric constant $d_{31}$ with respect to the transverse piezoelectric properties is sought by mechanically exciting a film at room temperature with 110 Hz by Vibron-II manufactured by Toyo Sokki Co., Ltd. of Japan and measuring the amount of AC electric charge generated on the film surface and the stress at the section of the film. Of previously known piezoelectric polymeric materials, that material have the highest performance is a poled polyvinylidene fluoride (hereinafter referred to as PVDF) film. However, according to the study of the present inventors, the $K_t$ of PVDF is about 0.2 at present if it is poled under good conditions, which is considerably smaller than the $K_t$ of piezoelectric ceramic material. It is difficult to prepare PVDF having a large $K_t$. Further, PVDF exhibits large dielectric loss and mechanical loss in the important working frequency range in practical use (not less than 1 MHz) of an ultrasonic transducer. Thus, PVDF not only generates heat when it is electrically driven, but also exhibits a lower efficiency. For these reasons, a piezoelectric ultrasonic transducer using PVDF is not ideal and the identification of a more efficient transducer material has been earnestly desired.

The piezoelectric properties of a polymeric material consisting of ethylene trifluoride and vinylidene fluoride P(VDF-TrFE) is described in Laid-open Japanese Patent Application No. 26995/1978. Studies on the polymer were presented by Higashihata, Yagi, Sako on Page 325; Uchidei, Iwamoto, Iwama, Tamura on Page 326; and Yamada, Ueda, Kitayama on Page 326 of Manuscripts of speeches at the meeting of the Applied Physics Society (April 1979 at Tokyo). These disclosures related to the piezoelectric properties ($d_{31}$) concerning the expansion and contraction in a direction parallel to the film surface.

SUMMARY OF THE INVENTION

The present invention does not utilize the piezoelectric properties ($d_{31}$) but rather utilizes the piezoelectric properties ($e_{33}$) of P(VDF-TrFE) with respect to the expansion and contraction of the film thickness.

It is an object of the present invention to provide a piezoelectric polymeric material consisting essentially of a copolymer consisting of vinylidene fluoride and ethylene trifluoride (P(VDF-TrFE)) having a large thickness extensional electromechanical coupling factor ($K_t$).

A still further object of the present invention is to provide an ultrasonic transducer utilizing a piezoelectric P(VDF-TrFE) film having a large $K_t$ as en electromechanical transducer element.

Other and further objects of the present invention subsequently will become apparent by reference to the following description in conjunction with the experimental data and the accompanying drawings.

In accordance with the present invention, a piezoelectric polymer material consisting essentially of a copolymer consisting of vinylidene fluoride and ethylene trifluoride (P(VDF-TrFE)) has the value of the thickness extentional electromechanical coupling factor ($K_t$) of at least 0.05, preferably of at least 0.1 and more preferably of at least 0.2.

Methods for the polymerization of the copolymer P(VDF-TrFE) have been described in a Laid-open Japanese Patent Application No. 53-26995; T. Yagi and M. Tatemato, *Polymer Journal,* Vol. 11, Pg. 429+ (1979); *Proceedings,* J. Sako, M. Tatemoto, and T. Yagi: 8th International Symposium on Fluoride Chemistry, Aug. (1976) at Kyoto, Japan.

The piezoelectric polymer material of the present invention is preferably a random copolymer consisting of 65-95 mol % of vinylidene fluoride, the balance essentially ethylene trifluoride. The molecular weight distribution varies somewhat with variations in the molar ratio but is summarized as follows:

| Molar Ratio of VDF/TrFE | M1 | M2 | M3 |
| --- | --- | --- | --- |
| 66/34 | 2.38 | 7.21 | 15.0 |
| 72/28 | 1.53 | 5.22 | 12.7 |
| 75/25 | 2.10 | 4.94 | 9.41 |
| 80/20 | 2.16 | 5.65 | 11.7 |
| 82/18 | 2.01 | 4.67 | 8.89 |

M1: The number average molecular weight.
M2: The weight average molecular weight.
M3: The Z average molecular weight.
All units of M1, M2, and M3 should be multiplied by $10^5$.

It is preferable that a piezoelectric polymeric material of the present invention consists solely of P(VDF-TrFE); however, the P(VDF-TrFE) may contain other copolymerization components such as ethylene tetrafluoride, vinylidene chloride, acrylonitrile within the scope of not substantially remarkably affecting the piezoelectric effect.

In accordance with the present invention, a process for producing a piezoelectric polymeric material which consists essentially of a copolymer consisting of P(VDF-TrFE) and which has the value of $K_t$ of at least 0.05 comprises heat-treating a shaped article consisting essentially of a copolymer consisting of 65-95 mol %, more preferably 70-82 mol %, of vinylidene fluoride and 35-5 mol %, more preferably 30-18 mol %, of ethylene trifluoride at a heat-treating temperature T (°C.) of from T'm-5(°C.) to Tm(°C.) and more preferably at a heat-treating temperature T(°C.) of from T'm(°C.) to Tm(°C.), and poling the heat-treated shaped article subsequent to or while heat-treating the same at the heat-treating temperature. T'm is the crystal phase transition temperature and Tm is the melting point temperature of the polymeric material. T'm-5(°C.) is a temperature of 5(°C.) below the crystal phase transition temperature T'm(°C.).

Where the shaped article does not show the crystal phase transition temperature T'm, the shaped article should be heat-treated so as to show the T'm before poling, or should be heat-treated while poling so as to show the T'm. Whether the shaped article of P(VDF-TrFE) possesses T'm or not depends on a ratio of VDF and TrFE, the method of forming employed (melt extruding, melt casting, solvent casting, etc.) the shaped article, a cooling condition (rapid cooling, moderate cooling, etc.) after forming the shaped article, a drafting condition while forming the shaped article, a drawing condition after forming the shaped article, a history of heat-treatment of the shaped article, etc.

The crystal phase transition temperature T'm is determined on a P(VDF-TrFE) DSC (differential scanning calorimetry) curve obtained by raising temperature at a rate of 10° C./min. The DSC curve shows an endothermic peak corresponding to the melting point and if the sample possesses same, one or more other endothermic peak(s) or shoulder(s) at the range of temprature lower than the temperature of the melting point. The T'm is determined to be the temperature corresponding to the peak or shoulder which is the closest to the peak corresponding to the melting point.

In the following description of methods for producing a piezoelectric material according to the present invention, a process of subjecting the shaped article to a poling treatment while imparting thereto a heat-treatment effect will be referred to as a direct poling method and a process of subjecting the shaped article to a poling treatment after heat-treating the shaped article will be referred to as a preheat-treating method.

In practicing the processes for producing a piezoelectric polymeric material according to the present invention, it is preferred that the poling electric field be as large as possible yet still be within the value which will not bring about dielectric breakdown. It is also preferred that a long poling time be employed. However, when the actual production efficiency is taken into account, in the case of the direct poling method, it is recommended that the poling voltage be within the range of about 50-1000 kV/cm and the poling time be within the range of about 1 minute-2 hours. On the other hand, in the case of the preheat-treating method, it is recommended that the preheat-treatment time be at least about 10 minutes, the poling voltage be within the range of about 50-1500 kV/cm and the poling time be within the range of about 1 minute-2 hours. In either of the aforesaid two cases, it is preferable from the viewpoint of retaining the shape of a produced piezoelectric material to subject the shaped article (film) under tension to a heat-treatment or poling treatment; however, when it is not necessary to particularly consider the point of retaining the shape, it is also possible to subject the film in a freely expanding or contracting state to a poling treatment, especially when the film is not preferentially oriented.

In a process for producing a piezoelectric polyermic material according to the present invention, the preheat-treating method has the following advantages over the direct poling method. In either of the two methods, it is an indispensable requirement to impart the effect of a heat-treatment at a temperature of at least (T'm-5)°C. to the shaped article. Accordingly, in the direct poling method, the poling treatment at a high temperature is required. However, the higher the poling temperature is, the lower becomes the dielectric breakdown voltage. Accordingly, it may become difficult to carry out the poling treatment at a high voltage. By contrast, in the preheat-treating method, because it is possible to separately select the heat-treatment temperature and the poling temperature, it has an advantage that when the poling treatment at a high voltage is required, it is possible to select as the poling temperature a low temperature to the extent of room temperature and produce piezoelectric polymeric material having good thickness piezoelectric properties that meet the objects of the present invention. In the case where it is required to produce a piezoelectric polymeric material by a poling treatment of the same together with a contiguous substrate thereof and it is difficult for this contiguous substrate to withstand a high temperature, it is possible, according to the preheat-treating method, to produce a piezoelectric polymeric material having good thickness piezoelectric properties together with its contiguous substrate by heat-treating the film at a high temperature in advance, annexing the film to the substrate and thereafter poling the film at a low temperature. Therefore, the preheat-treating method has an advantage in such case also.

In accordance with the present invention, a ultrasonic transducer comprises a piezoelectric vibrating element comprising a sheet of piezoelectric copolymer of P(VDF-TrFE), preferably the ratio of VDF/TrFE being within the range of 95/5-65/35 (mol %), more preferably 70/30-82/18 (mol %), which has the value of the thickness extentional electromechanicl coupling factor ($K_t$) of at least 0.05, preferably of at least 0.1 and more preferably of at least 0.2 and which vibrates under thickness piezoelectric properties.

An ultrasonic transducer of the present invention may be used by setting a stretched film having electrodes on its two surfaces on a supporting frame. More generally, it is used on a supporting base plate. It is possible to provide this supporting base plate on the front surface, rear surface or both of the two surfaces. It goes without saying that the material, shape and thickness of this supporting base plate are selected in accordance with the objects of the present invention.

By way of example, here are the following possible laminated structures from the rear surface to the front surface:

(a) a high polymer base plate/an electrode/a piezoelectric film/an electrode/an additional film;

(b) a high polymer base plate/a reflective plate/an electrode/a piezoelectric film/an electrode/an additional film;

(c) a reflective plate/an electrode/a piezoelectric film/an electrode/a high polymer block;

(d) a metal plate (concurrently acting as an electrode)/a piezoelectric film/a metal foil (concurrently acting as an electrode);

(e) an electrode/a piezoelectric film/an electrode/a high polymer base plate;

(f) an electrode/ a polymer film/a piezoelectric film/an electrode.

As used above, "a reflective plate" is a plate whose acoustic impedance is large enough to support a standing vibrational mode in the piezoelectric film with its nodal plane at a place close to the boundry between the reflective plate and the piezoelectric film. Such a reflective plate usually is thicker than the wavelength of sound in the plate at the working frequency but can also be about ¼ wavelength at the working frequency. However, a thinner plate having a thickness in an extent of about 1/16 wavelength may be used as well. In the case where the reflective plate is made of a metal, it may serve as an electrode as well. "An additional film" is a film provided for controlling the resonance frequency of a piezoelectric film and for serving also as a protecting film of an electrode as occasion demands. A high polymer film or a thin metal film is preferably used as an additional film.

Further, in a transducer of the present invention, it is possible not only to use a single layer of the P(VDF-TrFE) piezoelectric vibrator, but also to laminate a plurality of piezoelectric vibrators in the same polarization direction or laminate the adjoining films whose polarization directions are opposed. In the case of the former, it is possible to use the transducer wherein an electrode is not inserted between the adjoining films and in the case of the latter, it is possible to use the transducer wherein an electrode is inserted therebetween. The structure of the former is effective for lowering the resonance frequency and increasing the electric impedance, while the structure of the latter is effective for lowering the resonance frequency and lowering the impedance.

A transducer of the present invention is not limited to the use of one electrode, to a single piezoelectric film made of P(VDF-TrFE), or a set of laminated piezoelectric films, but may use a structure wherein plural pairs of electrodes are provided. In spite of the fact that the piezoelectric constant of P(VDF-TrFE) has a large $K_t$ value, its $d_{31}$ (and $d_{32}$) are smaller than those of PVDF. Its $k_{31}$ and $k_{32}$ are also smaller, accordingly. In case plural pairs of electrodes are provided adjoiningly, the electric-acoustic interaction between the adjoining electrodes is small and thereby advantageously minimizing any unwanted signal due to said interaction.

A transducer of the present invention is generally used for receiving and transmitting ultrasonic waves and it is used especially preferably as a transducer for nondestructive testing. Above all, it is used for ultrasonic diagnosis, especially for diagnosis of an organism. As to the shape of the transducer, various shapes are possible. There are, for example, concave convergence-type ultrasonic transducers or linear array-type transducers for electronic linear scanning, phased array-type transducers, Fresnel ring-type transducers or two-dimensional matrix array-type transducers. A transducer of the present invention can also be used as a Sokolov-type ultrasonic camera and as a transducer for an ultrasonic microscope. The operating frequency of this transducer varies depending on the thickness and strauctture of a piezoelectrid film. By producing the same by taking into account these facts, it is possible to obtain a transducer operating at 1 MHz-100 MHz. When this transducer is operated at a low temperature, it is possible to transmit and receive a frequency in excess of 100 MHz.

It is possible for a transducer of the present invention to have greater sensitivity (conversion efficiency) by about 3 dB or more (one pathway) (6 dB or more two pathways) compared with a transducer using PVDF as a piezoelectric polymer material. The transducer of the present invention has a higher performance than the performance of any existing piezoelectric polymeric ultrasonic transducer.

DESCRIPTION OF THE PREFERRED EMBODIMENTS

In the development of the present invention, it has been found that even though a piezoelectric material has large transverse piezoelectric properties, said piezoelectric material does not always have large thickness piezoelectric properties at the same time. With reference to P(VDF-TrFE), it has been found that the relation between the transverse piezoelectric properties and the thickness piezoelectric properties has roughly an inclination shown in FIG. 1 with respect to the composition ratio of VDF to TrFE. The hump in the graph of the thickness extensional electromechanical coupling factor, $K_t$, shown in FIG. 1 was surprising and unexpected.

In particular, it was found that for a piezoelectric body consisting of a shaped article of P(VDF-TrFE) of the composition ratio of VDF/TrFE which is within the range of 55/45 mol % the value of the constant $d_{31}$ showing the transverse piezoelectric properties assumes a maximum. As the ratio of VDF increases, the value of the $d_{31}$ appreciably suddenly decreases, but when the composition ratio exceeds about 75/25 mol %, the value of the $d_{31}$ increases again. On the other hand, when the character of the thickness piezoelectric properties are observed with respect to the composition ratio of VDF-TrFE from the value of the electromechanical coupling factor $K_t$ (which is roughly in proportion to the thickness piezoelectric properties considered most proper to indicate the quality of the performance as an electromechanical transducer element utilizing the thickness piezoelectric properties which is one of the objects of the present invention than the piezoelectric constant $d_{33}$ showing the thickness piezoelectric properties), it is found that at the composition ratio of VDF/TrFE of 55/45 mol %, namely, the composition ratio at which the aforesaid transverse piezoelectric constant $d_{31}$ shows the maximum value, the value of the $K_t$ is so small as hardly to be able to be utilized as an ultrasonic transducer. From a point where the ratio of VDF exceeds 65 mol %, the value of the $d_{31}$ shows an inclination of sudden decrease, whereas the $K_t$ shows a large value to an extent of being able to be offered for practical use. The $K_t$ value further increases and at a point where the composition ratio of VDF/TrFE is in the vicinity of 75/25 mol %, the $K_t$ shows the maximum value. Thereafter, as the ratio of VDF increases, the value of the $K_t$ decreases. Thereafter, when the ratio of VDF passes a point in the vicinity of 95 mol %, the value of the $K_t$ again shows an inclination of increasing.

Figure 1:
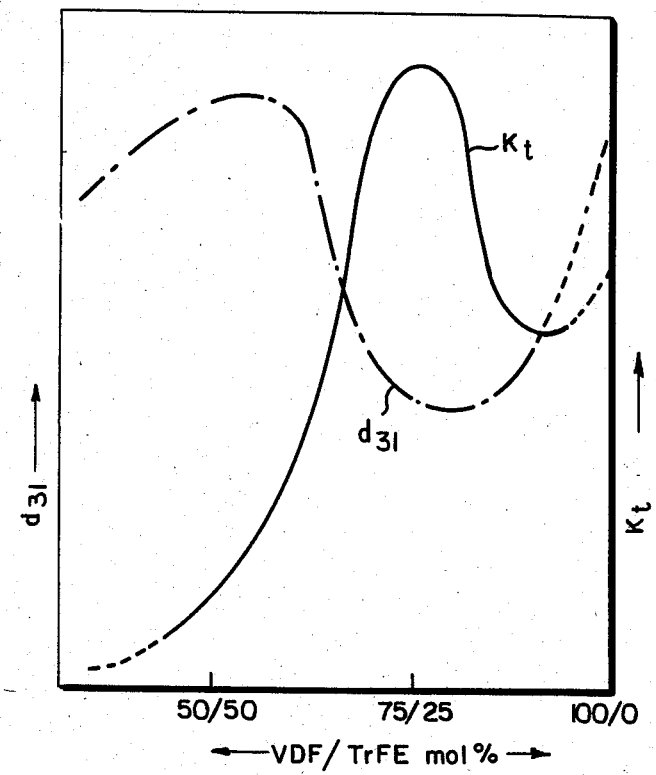
FIG. 1 is a graph showing the variation of the values of the piezoelectric constant $d_{31}$ and the electromechanical coupling factor $K_t$ as a function of the VDF-TrFE composition ratio of P(VDF-TrFE).

From FIG. 1, it can be seen that in order to obtain a piezoelectric material good in thickness piezoelectric properties, selection of the composition ratio of VDF/TrFE different from that of a piezoelectric material good in transverse piezoelectric properties is at least necessary. The reason it is stated herein as "at least necessary" is, when the composition ratio of VDF-TrFE is merely selected in accordance with an inclination shown in FIG. 1 and when that shaped article is merely subjected to a poling treatment, said shaped article may not become a piezoelectric material having a sufficient value of the electromechanical coupling factor $K_t$ capable of being immediately offered for practical use. In order to produce a piezoelectric body having a sufficient value of $K_t$ capable of being offered for practical use, it should be poled after being imparted with a heat-treatment effect under specified conditions or should be poled while a heat-treatment effect is being imparted thereto.

Hereinbelow, the present invention will be further explained using examples and comparative examples.

COMPARATIVE EXAMPLES C1-C4

P(VDF-TrFE) having the composition ratio of VDF/TrFE of 37/63 mol % was hot pressed at 250° C. The obtained film was rolled at 70° C. to be drawn to about 4 times to obtain a drawn film having a thickness of about 40 μm. On the two surfaces of this drawn film was vacuum evaporated Al to form electrodes and the film was subjected to a poling treatment under conditions shown in Table 1. Alternatively, the film was heat-treated in advance and then subjected to the poling treatment. The values of the piezoelectric constant $d_{31}$ showing the transverse piezoelectric properties and the values of the electromemechanical coupling factor $K_t$ showing the thickness piezoelectric properties of the obtained piezoelectric bodies are shown in Table 1.

The preheat-treatment was carried out in air atmosphere for 1 hour. The melting point temperature Tm of the drawn film used in these comparative examples was about 167° C. and the crystal phase transition temperature T'm of said film was about 50° C.

Because these comparative examples used the shaped article of P(VDF-TrFE) having the composition ratio of VDF/TrFE outside the range defined by the present invention, it is shown that even though the preheat-treating temperature or the poling temperature was in excess of (T'm-5)°C., piezoelectric bodies each having a large electromechanical coupling factor $K_t$ could not be produced.

COMPARATIVE EXAMPLES C8-C11

A film obtained by hot pressing P(VDF-TrFE) having the composition ratio of VDF/TrFE of 55/45 mol % at 250° C. was uniaxially drawn to about 3.4 times at 40° C. to obtain a drawn film having a thickness of about 50 μm in Comparative Examples C8-C10 and rolled at 40° C. to obtain a drawn film having at thickness of about 50 μm in Comparative Example C11. On the two surfaces of each of these drawn films was vacuum evaporated Al to form electrodes and the respective films were subjected to poling treatments or subjected to a heat-treatment in advance and thereafter subjected to a poling treatment under conditions shown in Table 3. The values of the piezoelectric constant $d_{31}$

TABLE 1

| | Preheat-Treatment Temp (°C.) | Poling Conditions Temp (°C.) | Poling Conditions Voltage (kV/cm) | Poling Conditions Time (hr) | Piezoelectric Characteristics $d_{31}$ ($10^{-12}$C/N) | Piezoelectric Characteristics $K_t$ |
|---|---|---|---|---|---|---|
| Comp Example C1 | None | 50 | 300 | 1 | 13.4 | Below 0.01 |
| Comp Example C2 | None | 80 | 300 | 1 | 24.2 | Below 0.01 |
| Comp Example C3 | None | 100 | 300 | 1 | 21.9 | Below 0.01 |
| Comp Example C4 | 140 | 100 | 300 | 1 | 22.3 | Below 0.01 |

COMPARATIVE EXAMPLES C5-C7

P(VDF-TrFE) having the composition ratio of VDF/TrFE of 49/51 mol % was hot pressed at 250° C. and the obtained film was rolled at 80° C. to be drawn to about 2 times to obtain a drawn film having a thickness of about 50 μm. On the two surfaces of this drawn film was vacuum evaporated Al to form electrodes and the film was subjected to poling treatments. The values of the piezoelectric constant $d_{31}$ and the values of the electromechanical coupling factor $K_t$ of the obtained piezoelectric bodies are shown in Table 2.

The melting point temperature Tm of the drawn film used in these comparative examples was about 160° C. and the crystal phase transition temperature T'm of said film was about 60° C.

Because these comparative examples used the shaped article of P(VDF-TrFE) whose composition ratio of VDF/TrFE was outside the range defined by the present invention, even though the poling temperatures were more than (T'm-5)°C., the increase of that electromechanical coupling factor $K_t$ was not seen. Said $K_t$ was 0.01 or less and did not exceed 0.05.

and the values of the electromechanical coupling factor $K_t$ of the obtained piezoelectric bodies are shown in Table 3.

The preheat-treatment was carried out in air atmosphere for 1 hour. The melting point temperature Tm of the drawn film used in Comparative Examples C8-C10 was about 156° C. and the crystal phase transition temperature T'm of said drawn film was 81° C. The melting point temperature Tm of the drawn film used in Comparative Example 11 was about 155° C. and the crystal phase transition temperature T'm of said film was about 82° C.

Because these comparative examples used the shaped article of P(VDF-TrFE) having the composition ratio of VDF/TrFE which was outside the range defined by the present invention, even though the poling temperatures or preheat-treating temperature was more than (T'm-5)°C., the increase of the electromechanical coupling factor $K_t$ was not seen. Said $K_t$ was 0.02 or 0.03, or still small and insufficient for being offered for practical use.

TABLE 3

| | Preheat-Treatment Temp (°C.) | Poling Conditions Temp (°C.) | Poling Conditions Voltage (kV/cm) | Poling Conditions Time (hr) | Piezoelectric Characteristics $D_{31}$ ($10^{-12}$C/N) | Piezoelectric Characteristics $K_t$ |
|---|---|---|---|---|---|---|
| Comp Example C8 | None | 50 | 300 | 1 | 14.5 | Below 0.01 |
| Comp Example C9 | None | 80 | 300 | 1 | 17.6 | Below 0.01 |
| Comp Example C10 | None | 100 | 300 | 1 | 28.4 | 0.02 |
| Comp Example C11 | 140 | 80 | 200 | 1 | 25.5 | 0.03 |

EXAMPLE 1

P(VDF-TrFE) having the composition ratio of VDF/TrFE of 75/25 mol % was extruded at 210° C.,

TABLE 2

Figure 2:
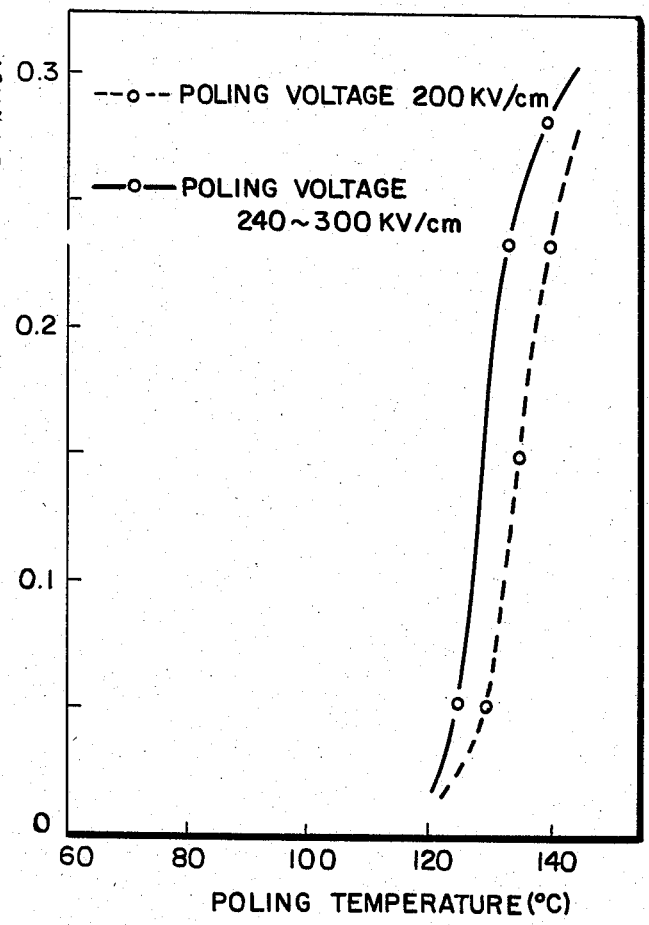
FIG. 2 is a graph showing the relation between the electromechanical coupling factor $K_t$ and the poling temperature.
Figure 3:
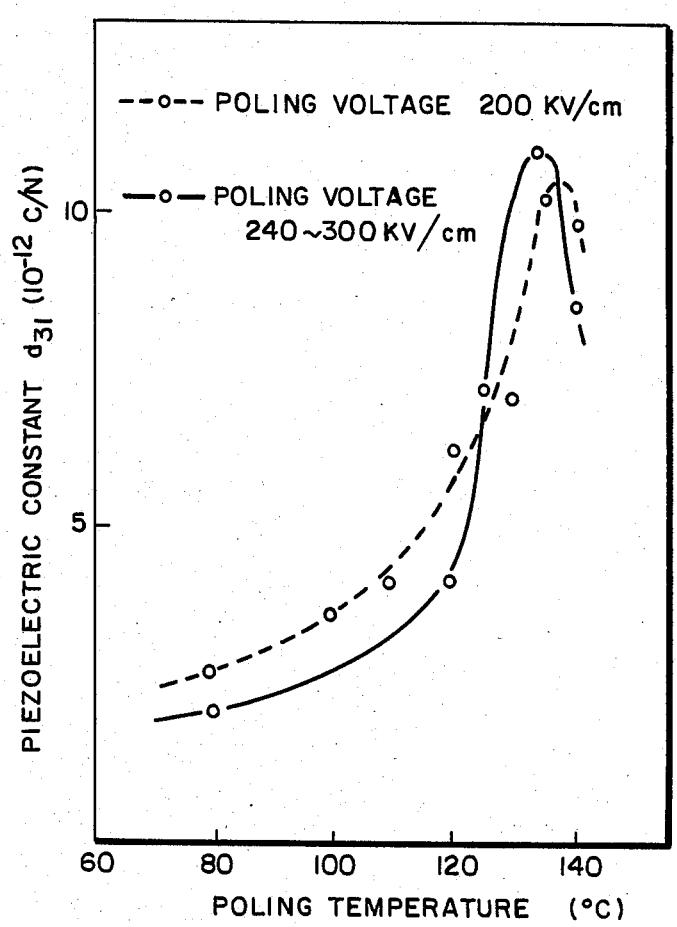
FIG. 3 is a graph showing the relation between the piezoelectric constant $d_{31}$ and the poling temperature.
Figure 4:
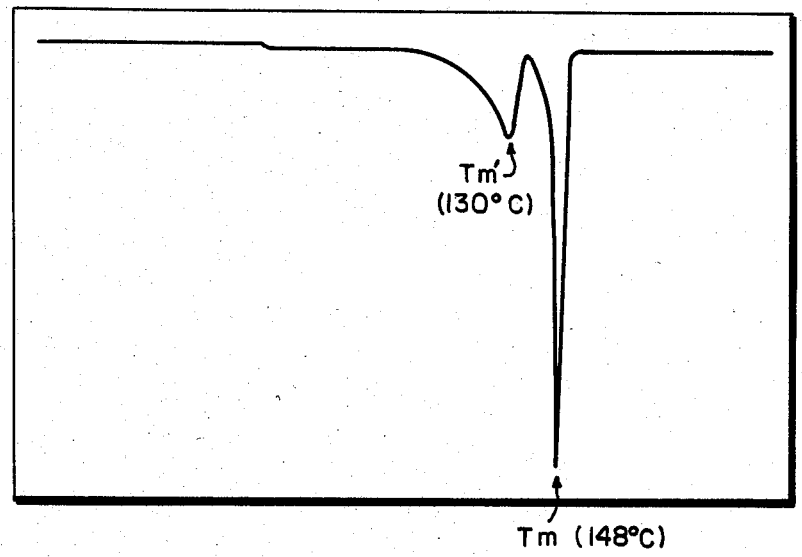
FIG. 4 is a graph showing a DSC (differential scanning calorimetry) curve at a temperature raising speed of 10° C./min of a film treated under fixed conditions.

| | Preheat-Treatment Temp (°C.) | Poling Conditions Temp (°C.) | Poling Conditions Voltage (kV/cm) | Poling Conditions Time (hr) | Piezoelectric Characteristics $d_{31}$ ($10^{-12}$C/N) | Piezoelectric Characteristics $K_t$ |
|---|---|---|---|---|---|---|
| Comp Example C5 | None | 50 | 300 | 1 | 8.85 | Below 0.01 |
| Comp Example C6 | None | 80 | 300 | 1 | 17.0 | Below 0.01 |
| Comp Example C7 | None | 100 | 300 | 1 | 10.9 | Below 0.01 | the obtained film was rolled at room temperature and drawn to about 3 times to obtain a drawn film having a thickness of about 35 μm. On the two surfaces of this drawn film was vacuum evaporated Al to form electrodes and said film was subjected to a poling treatment by the direct poling method at a poling temperature of 80°–140° C. and a poling voltage of 200–300 kV/cm for 1 hour to produce piezoelectric bodies. The values of the electromechanical coupling factor $K_t$ of the piezoelectric bodies obtained as a result are shown in FIG. 2 and the values of the piezoelectric constant $d_{31}$ of said bodies are shown in FIG. 3. The melting point temperature Tm of the drawn film used in this example was about 148° C. and the crystal phase transition temperature T'm of said film was about 130° C. The DSC (differential scanning calorimetry) curve of this film is shown in FIG. 4.

Figure 5:
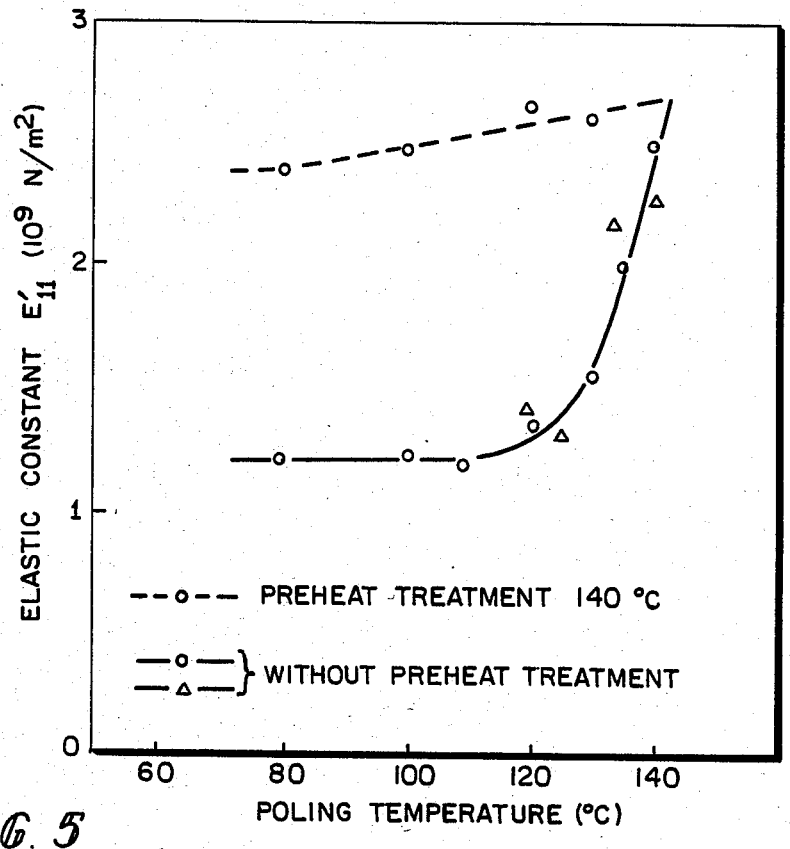
FIG. 5 is a graph showing the relation between the elastic constant (Young's modulus) $E'_{11}$ and the poling temperature and the preheat-treating temperature.

FIG. 2 shows that by the use of the shaped article of P(VDF-TrFE) having the composition ratio of VDF/TrFE within the range defined by the present invention and by carrying out the poling treatment at a poling temperature selected from the range of the poling temperature defined by the present invention, it is possible to produce a piezoelectric body having a good value of the electromechanical coupling factor $K_t$. Moreover, FIG. 2 shows that when the poling temperature is less than (T'm-5)°C., the electromechanical coupling factor $K_t$ is too small to be detected; however, when the poling temperature becomes at least (T'm-5)°C., the electromechanical coupling factor $K_t$ suddently increases and when said temperature becomes at least T'm, said factor becomes at least 0.1 and when the poling temperature becomes about 140° C., a piezoelectric body, the value of whose electromechanical coupling factor $K_t$ reaches about 0.3 is obtained. The elastic constant $E'_{11}$ (Young's modulus measured at 110 Hz) along the X direction of a piezoelectric body obtained by subjecting said drawn film to a poling treatment at a poling temperature of 80°–140° C. and a poling voltage of about 210 KV/cm for 1 hour by the direct poling method, is shown as a function of poling temperature by a solid line in FIG. 5. This FIG. 5 shows that when the poling temperature becomes at least (T'm-5)°C., the value of the elastic constant $E'_{11}$ suddenly increases. It has also been found that the sound velocity and elastic constant $C_{33}^D$ increases when the poling temperature becomes at least (T'm-5)°C.

EXAMPLE 2

On the two surfaces of the same drawn film as used in Example 1 was vacuum evaporated Al, said film was heat-treated by the preheat-treating method and thereafter poled to produce a piezoelectric body. The heat-treating was performed at 140° C. in air atmosphere for 1 hour and after the treatment, the film was taken out to an atmosphere at room temperature and allowed to stand therein. The so obtained heat-treated film was then subjected to a poling treatment at a temperature of 80°–140° C. and at a poling voltage of 210 kV/cm for 1 hour. The values of the electromechanical coupling factor $K_t$ are shown in FIG. 6 and the values of the piezoelectric constant $d_{31}$ of said piezoelectric bodies are shown in FIG. 7.

Figure 6:
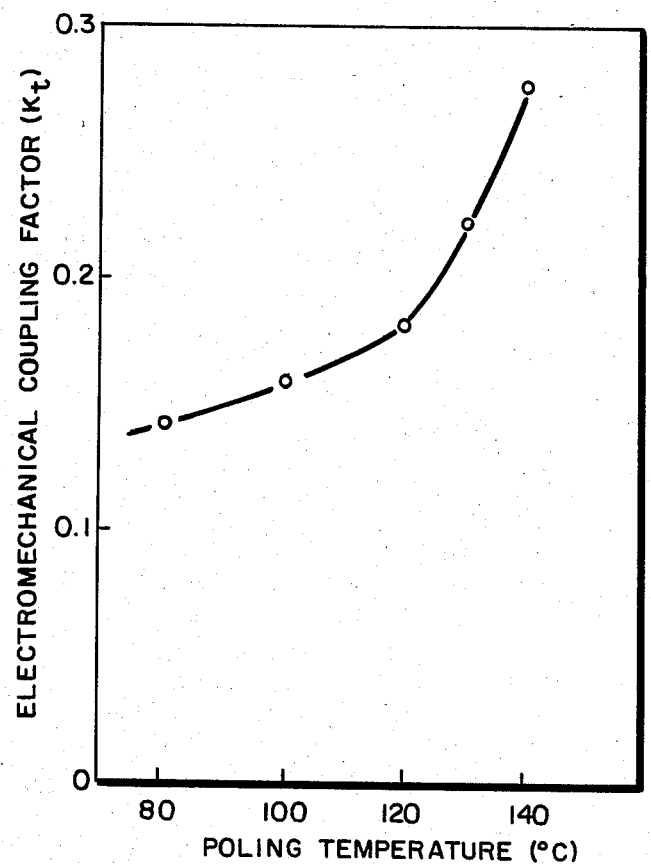
FIG. 6 is a graph showing the relation between the electromechanical coupling factor $K_t$ of the preheat-treated film and the poling temperature.
Figure 7:
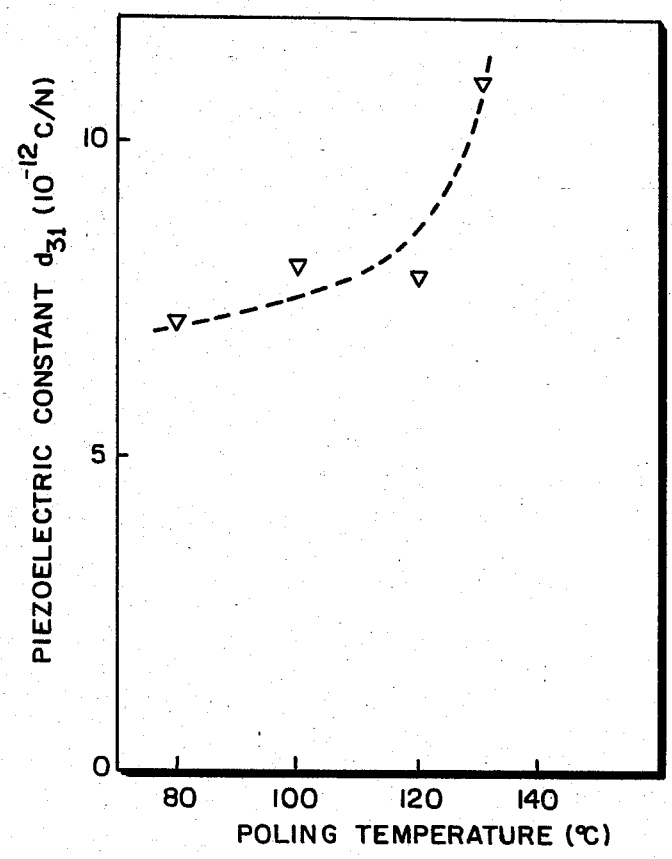
FIG. 7 is a graph showing the relation between the piezoelectric constant $d_{31}$ of the preheat-treated film and the poling temperature.

FIG. 6 shows that when the piezoelectric bodies are heat-treated in advance at a temperature of at least (T'm-5)°C., even though low temperatures are selected in the poling treatment, it is possible to produce piezoelectric bodies having the desired values of the electromechanical coupling factor $K_t$. This point is more clearly understood by comparing FIG. 6 with FIG. 2, which evidences the advantage of the aforesaid preheat-treating method. On the other hand, the values of the elastic constant $E'_{11}$ of the so obtained piezoelectric bodies are shown in dotted lines in said FIG. 5. This FIG. 5 shows that according to the preheat-treating method, even though the poling treatment is carried out at low poling temperatures, it is possible to produce piezoelectric bodies having large values of the elastic constant $E'_{11}$. The piezoelectric bodies having large values of this elastic constant $E'_{11}$ mean that when they are used as ultrasonic transducers utilizing the thickness piezoelectric properties of the piezoelectric bodies, they are advantageously used as good vibrators because their mechanical losses are small.

EXAMPLES 3–7

The values of the electromechanical coupling factor $K_t$ shown in Table 4 for the piezoelectric bodies were obtained by subjecting the heat-treated film obtained in Example 2 to poling treatments at the poling temperatures and poling voltages shown in Table 4.

This Table 4 shows in Table 4.

This Table 4 shows that according to the preheat-treating method, even when the poling temperature is 60° C. or even room temperature, it is possible to produce piezoelectric bodies having practically usable values of the electromechanical coupling factor $K_t$.

TABLE 4

| | Poling Conditions | | Piezoelectric Characteristics |
|---|---|---|---|
| | Temp (°C.) | Voltage (kV/cm) | $K_t$ |
| Example 3 | 60 | 171 | 0.126 |
| Example 4 | 60 | 333 | 0.193 |
| Example 5 | 60 | 364 | 0.258 |
| Example 6 | 60 | 474 | 0.301 |
| Example 7 | Room temp. (25) | 528 | 0.281 |

EXAMPLE 8

A film obtained by heat pressing at 250° C. P(VDF-TrFE) having the composition ratio of VDF/TrFE of 75/25 mol % was rolled and drawn to about 2.5 times to obtain a drawn film having a thickness of about 50 μm. On the two surfaces of this drawn film was vacuum evaporated Al to form electrodes and the film was subjected to a poling treatment under conditions shown in Table 5. The value of the piezoelectric constant $d_{31}$ and the value of the electromechanical coupling factor $K_t$ of the obtained piezoelectric body are shown in Table 5.

Figure 8:
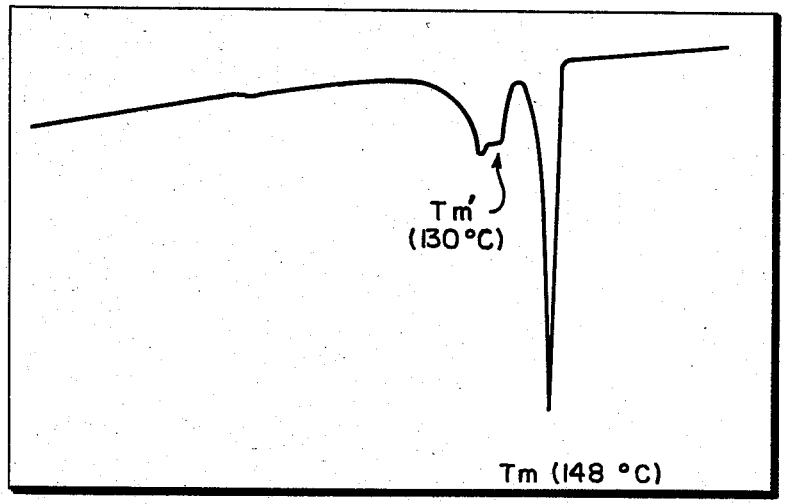
FIG. 8 is a graph showing a DSC (differential scanning calorimetry) curve at a temperature raising speed of 10° C./min of a film treated under fixed conditions other than those of the case of FIG. 4.

For information, the melting point temperature Tm of the drawn film used in this example was about 148° C. and the crystal phase transition temperature T'm of said film was about 130° C. The DSC curve of this film is shown in FIG. 8.

TABLE 5

| | Preheat-treatment Temp (°C.) | Poling Conditions | | | Piezoelectric Characteristics | |
|---|---|---|---|---|---|---|
| | | Temp (°C.) | Voltage (kV/cm) | time (hr) | $d_{31}$ ($10^{-12}$C/N) | $K_t$ |
| Ex. 8 | None | 130 | 200 | 1 | 9.2 | 0.104 |

COMPARATIVE EXAMPLE C12 AND EXAMPLE 9

A film obtained by hot pressing at 250° C. P(VDF-TrFE) having the composition ratio of VDF/TrFE of 82/18 mol % was not drawn, but on the two surfaces of said film was vacuum evaporated Al to form electrodes and the film was subjected to poling treatments under conditions shown in Table 6. The values of the piezoelectric constant $d_{31}$ and the values of the electromechanical coupling factor $K_t$ of the obtained piezoelectric bodies are shown in Table 6.

Figure 9:
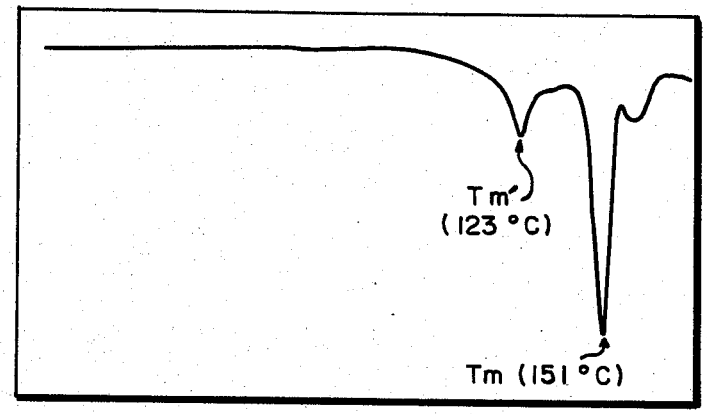
FIG. 9 is a graph showing a DSC (differential scanning calorimetry) curve at a temperature raising speed of 10° C./min of a film treated under the further different fixed conditions.

For information, the melting point temperature Tm of the non-drawn film used in this comparative example and example was about 151° C. and the crystal phase transition temperature T'm of said non-drawn film was about 123° C. The DSC curve of these temperatures is shown in FIG. 9.

This comparative example and example show that in the case of P(VDF-TrFE) having the composition ratio of VDF/TrFE of 82/18 mol %, namely, within the range defined by the present invention, when the poling temperature imparting the heat-treatment effect is less than (T'm-5)°C., namely, outside the range defined by the present invention, the value of the electromechanical coupling factor $K_t$ is 0.01, which is small; however, by selecting the poling temperature of at least (T'm-5)°C., further, T'm per se (in this case, it is about 123° C. as mentioned above), it is possible to produce a piezoelectric body having the value of the electromechanical coupling factor $K_t$ of 0.09 or a significantly increased value.

TABLE 6

| | Preheat-treatment Temp (°C.) | Poling Conditions Temp (°C.) | Poling Conditions Voltage (kV/cm) | Poling Conditions Time (hr) | Piezoelectric Characteristics $d_{31}$ ($10^{-12}$C/N) | Piezoelectric Characteristics $K_t$ |
|---|---|---|---|---|---|---|
| Comp Example C12 | None | 80 | 300 | 1 | 0.61 | 0.010 |
| Example 9 | None | 140 | 313 | 1 | 6.0 | 0.090 |

EXAMPLE 10

On the two surfaces of a 34 μm thick P(VDF-TrFE) film having a VDF/TrFE composition ratio of 75/25 mol % drawn by rolls at 70° C. was vacuum evaporated Al to form electrodes and said film was heat-treated at 140° C. for 1 hour. Subsequently, 1300 KV voltage was applied to a space between said electrodes at 130° C., said film was held for 1 hour and thereafter cooled per se to room temperature to effect a poling treatment.

Figure 10:
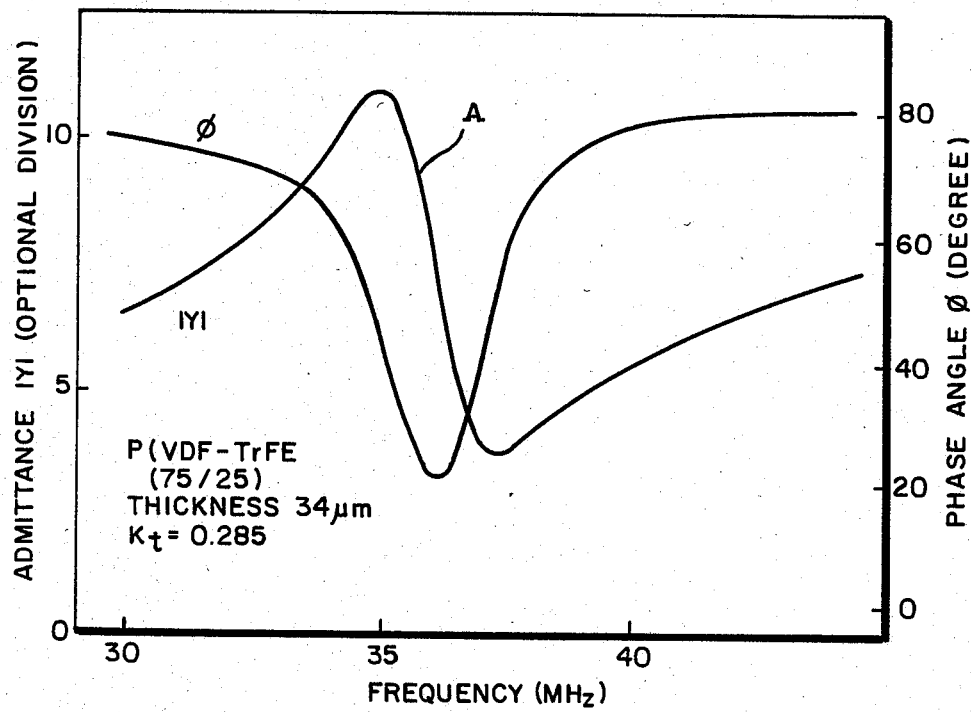
FIG. 10 is a drawing showing the relation of the admittance and phase angle with the frequency of an ultrasonic transducer according to Example 10 of the present invention.

From this film, a 1 cm² disk was cut out and based on the method described in H. Ohigashi, J. Appl. Phys., 47 949 (1976), from the electric behavior in the vinicity of a resonance point of a piezoelectric thickness free vibrator, the electric acoustic properties of this P(VDF-TrFE) piezoelectric body were measured. FIG. 10 is a graph showing a result obtained by measuring at room temperature the relation of the absolute value of the electric admittance in an acoustically non-load state of said thickness piezoelectric vibrator element and its phase angle, respectively with respect to the frequency. The resonance peak of the |Y|v. f curve (curve A) in FIG. 10, the difference from a valley in the vicinity of an anti-resonance point, and the varied amount of the phase angle are larger than those of any hitherto known high polymer piezoelectric vibrator.

Table 7 shows various constants obtained by comparing the admittance expected from the admittance of the vibrator.

TABLE 7

| | P(VDF-TrFE) | PVDF |
|---|---|---|
| Electromechanical coupling factor $K_t$ | 0.285 | 0.20 |
| Piezoelectric constant $e_{33}$ (C/m²) | −0.23 | −0.165 |
| Sonic speed $v_3^D$ (m/s) | 2460 | 2260 |
| Density ($10^3$ kg/m³) | 1.85 | 1.78 |
| Elastic constant $C_{33}^D$ ($10^9$ N/m²) | 11.2 | 9.47 |
| Dynamic loss $\psi$ | 0.05 | 0.1 |
| Dielectric constant $\epsilon_3^S/\epsilon_0$ | 6.5 | 6.2 (5.6) |
| Dielectric loss $\phi$ | 0.20 | 0.25 |
| *Piezoelectric constant $d_{31}$ ($10^{-12}$C/N) | 14 | 27.0 |

*Value at 110 Hz (non-resonance)
PVDF was what was obtained by subjecting a 4-time drawn film to a poling treatment at a poling temperature of 120° C. for a poling time of 1 hour at a poling voltage of 800 KV/cm.

The constants with reference to PVDF similarly sought are also tabulated in Table 7. Again, comparison of piezoelectric constant $d_{31}$ concerning expansion and contraction in the drawing direction is shown also.

As is shown in Table 7, P(VDF-TrFE) has a $K_t$ value larger than that of PVDF, having dielectric loss and mechanical loss smaller than those of PVDF. This fact means that the efficiency at which electric energy (mechanical energy) put into the vibrator is converted to mechanical energy (electric energy) is good and the possibility that electric energy (mechanical energy) is converted to heat energy is small, showing that the vibrator is good.

The element obtained in this example was adhered to one surface of a PMMA (polymethyl methacrylate) block (A) and a 6 mm PMMA plate (B) was adhered to the other surface to prepare a waterproof ultrasonic transducer. This transducer was immersed in water and at a position 3 mm forward from the transducer, a 1 mm thick brass plate was placed in parallel to the PMMA plate (B). This transducer was excited with a short pulse to generate an ultrasonic pulse, the reflective signal of which was received by the same transducer. Of this reflective signal, from signals from multi-reflection by the front surface and rear surface of brass, the thickness of the brass plate could be measured. By this example, it was confirmed that this transducer generated ultrasonic waves having a practically sufficient intensity.

EXAMPLE 11

Figure 11:
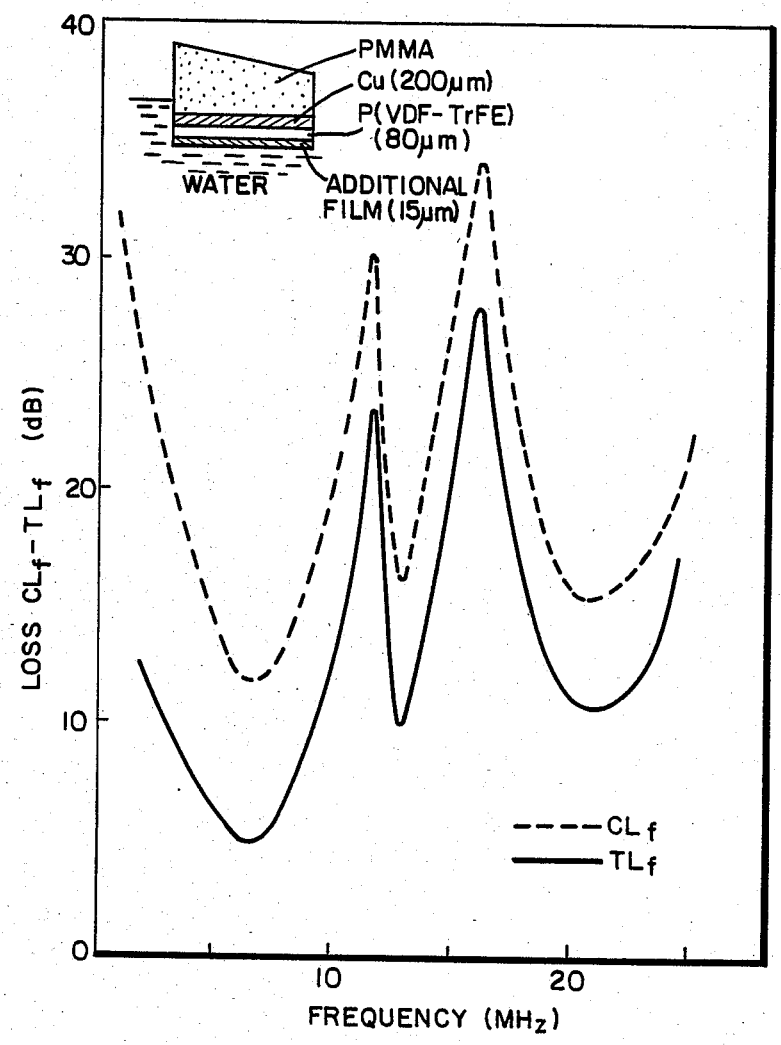
FIG. 11 is a drawing showing the relation of the two kinds of conversion losses with the frequency in Example 11 of the present invention.

A shown in FIG. 11, the frequency characteristics of two kinds of conversion losses $CL_f$ and $TL_f$ by underwater driving of an ultrasonic transducer obtained by successively laminating a PMMA base plate, a copper plate (200 μm), P(VDF-TrFE) (area 1.32 cm², thickness 80 μm) and a high polymer additional film (aromatic polyamide, 15 μm) were sought using a Mason's circuit. Said $CL_f$ was defined by $CL_f = -10 \log (P_{Af}/P_O)$ wherein $P_O$ was the maximum electric power utilizable from a 50 Ohm power source and $P_{Af}$ was an acoustic power output into water of the transducer. Said $TL_f$ was defined by $TL_f = -10 \log (P_{Af}/P_T)$ wherein $P_T$ was an effective electric power put into the transducer from the power source. The effective area of the aforesaid transducer was 1 cm² and the copper plate concurrently acted as a back surface electrode and an acoustic reflective plate. On the surfaces of the P(VDF-TrFE) film, confronting electrodes were provided. As the physical property constants of P(VDF-TrFE), the values in Table 7 were used. The results are shown in FIG. 11. At the most efficiently operating resonance frequency (65 MHz), $CL_f$ and $TL_f$ were about 12 dB and 5 dB, respectively and improvements by 3-4 dB were seen from a transducer using the same constitution of PVDF ($K_t=0.2$). This makes increase of the sensitivity on two pathways by 6 dB in ultrasonic diagnosis used by a pulse reflection method, meaning that this transducer has a very good S/N (signal to noise ratio).

From a laminated film (thickness about 80 μm) obtained by overlapping 2 films (each having a thickness of about 40 μm) obtained in the same manner as in Example 10 with their polarization directions being made in parallel to each other, a transducer having a structure shown in FIG. 11 was produced and the frequency characteristics of its losses were measured by operation in water. The results were a central frequency of within 0.5 MHz and a $TL_f$ of within 3 dB, both being well in accordance with the results shown in FIG. 11.

EXAMPLE 12

Figure 12:
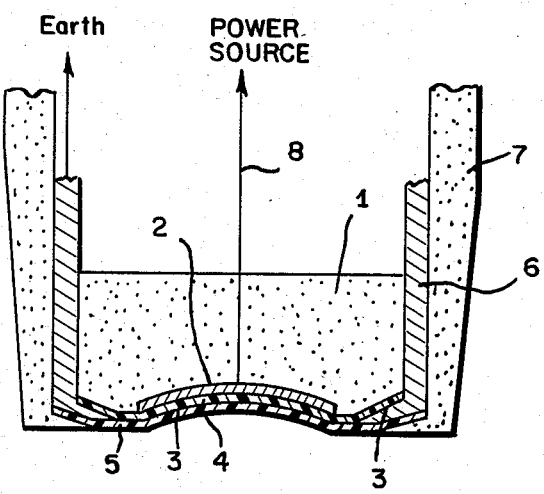
FIG. 12 is an enlarged section showing the structure of the transducer in Example 12 of the present invention.
Figure 13:
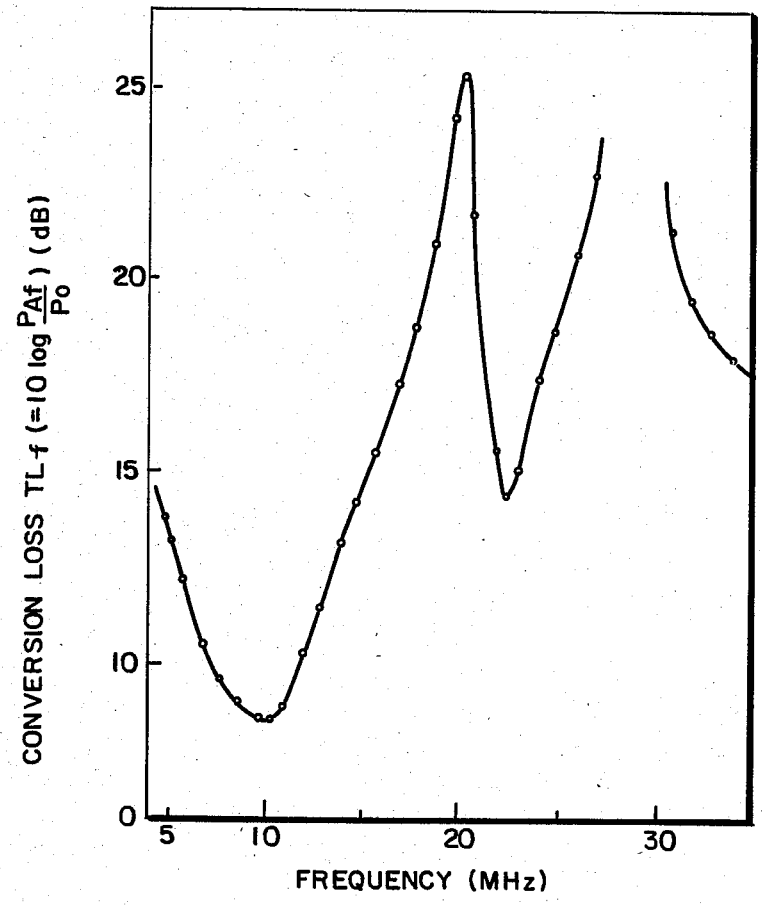
FIG. 13 is a drawing showing the relation between the conversion loss and the frequency of the transducer shown in FIG. 12

As shown in FIG. 12, a 100 μm thick copper plate 2 (radius 13 mm) shaped into a concave state by a mold having a radius of curvature of 70 mm was adhered onto a PMMA base plate 1. To this was adhered a 43 μm thick P(VDF-TrFE) piezoelectric film 4 (diameter 19 mm) having an Al vacuum evaporated electrode 3 on one surface, to the electrode 3 on the piezoelectric film was electrically connected a metal case for grounding 6, thereafter, onto the piezoelectric film was adhered a polyester film 5 (thickness 15 μm) for the purpose of protecting the surface and reducing the operating frequency. The entire structure was accommodated inside a plastic case 7. By applying a burst-like high frequency electric power to a space between a leading wire 8 connected to the copper plate electrode 2 and the grounded case 6, the frequency characteristics of the conversion loss $TL_f$ of this transducer in the case of the underwater operation were measured by a pulse reflection method. The results are shown in FIG. 13. The piezoelectric body made of P(VDF-TrFE) used in this example had a molar ratio of its components of 75/25, being obtained by vacuum evaporating Al on the two surfaces of a film drawn by rolls at 70° C. and thereafter subjecting the film to a poling treatment at a poling temperature of 133° C., a poling voltage of 250 kV/cm for a poling time of 1 hour. As a result of analyzing the frequency characteristics of the impedance of the free vibrator, the value of $K_t$ was found to be 0.24.

As shown in FIG. 13, the $TL_f$ of this transducer at the center frequency of 10 MHz was 8.5 dB. Because the minimum $TL_f$ experimentally obtained by a transducer similarly constituted using a PVDF piezo-electric film ($K_t=0.2$) and poled under good conditions was 11 dB, it is seen that by the use of P(VDF-TrFE) ($K_t=0.24$), an improvement by about 2.5 dB was made.

For efficiently driving this transducer by a 50 Ohm power source, a matching circuit consisting of a matching coil and an impedance conversion transformer was inserted between the power source and a piezoelectric element. As a result, it was possible to almost remove the reflection between the transducer and the power source. The loss ($-10 \log P_{Af}/P_O$) of the so matched transducer was 8.5 dB at 10 MHz.

Typical experimental data is shown in Tables 8-12. Some experiments shown in Tables 8-12 have been described more precisely in the above examples and comparative examples. Columns I-XII in Tables 8-12 mean as follows:

Column I: Experiment No.

Column II: Content of VDF (mol %) in copolymer of P(VDF-TrFE). 72/79 means that two kinds of the copolymers are blended with same volume.

Column III: Forming conditions of shaped article of copolymer of P(VDF-TrFE).

Notes in Column III (1) HP (250) means that the shaped article is [are] formed by a hot pressing at a temperature of 250° C.

(2) RD (50) means that the shaped article formed by hot pressing is drawn by between a pair of nip rolls at a temperature of 50° C.

(3) ME means that the shaped article is formed by melt extruding.

(4) SC means that the shaped article is formed by solvent casting.

(5) VD means that the shaped article formed by the solvent casting is dryed in vacuum atmosphere.

(6) IWC means that the freshly shaped article formed by the hot pressing is cooled with ice and water.

(7) AC means that the freshly shaped article formed by the hot pressing is cooled in room air atmosphere.

(8) WC (40) means that the freshly shaped article formed by the hot pressing is cooled with water having a temperature of 40° C.

(9) DWC (20) means that the freshly shaped article formed by the melt extruding is cooled with shower of water have a temperature of 20° C. on a drafting drum of the shaped article.

(10) DAC means that the freshly shaped article formed by the melt extruding is cooled in room air on a drafting drum of the shaped article.

(11) AC (140) means that the freshly shaped article formed by the hot pressing is heat-treated to 140° C. for 1 hour by maintaining the shaped article in hot air atmosphere in the course of cooling down the article to room temperature.

Column IV: Conditions of drawing the shaped article. Semi-column A shows drawing temperature (°C.) and B shows drawing ratio.

Column V: Thickness (μm) of the shaped article being subjected to preheat-treating or direct poling.

Column VI: Semi-column A shows a temperature (°C.) of melting point (Tm) and B shows crystal phase transition temperature (°C.) (T'm) of the shaped article being subjected to preheat-treating or direct poling. The numeral enclosed with parentheses means the shoulder showing T'm is not so clear.

Column VII: Preheating conditions. Semi-column A shows a temperature (°C.) of preheating and B shows a time (hr) for preheating.

Column VIII: Poling conditions. Semi-column A shows a temperature (°C.) of poling and B shows a time (hr) for poling.

Column IX: Semi-column A shows a temperature (°C.) of melting point (Tm) and B shows crystal phase transition temperature (°C.) (T'm) of the shaped article after preheat-treating or poling.

Column X: Semi-column A shows poling voltage (kV/cm) and B shows thickness extensional electromechanical coupling factor ($K_t$).

Column XI: Semi-column A shows poling voltage (kV/cm) and B shows transverse piezoelectric property ($d_{31}$) ($10^{-12}$C/N).

Column XII: "NO" means that the experimental sample is out of the scope of the present invention and "YES" means that the experiment sample is in the scope of the present invention.

TABLE 8

| I | II | III | IV A | IV B | V | VI A | VI B | VII A | VII B | VIII A | VIII B | IX A | IX B | X A | X B | XI A | XI B | XII |
|---|---|---|---|---|---|---|---|---|---|---|---|---|---|---|---|---|---|---|
| PD 90 | 37 | HP(250)·RD(70) | 70 | 4 | 40 | 167 | 50 | none | — | 50 | 1 | — | — | 300 | <0.01 | 300 | 13.4 | NO |
| PD 67 | 37 | " | " | " | " | " | " | " | " | 80 | " | — | — | " | " | " | 24.2 | " |
| PD 69 | " | " | " | " | " | " | " | " | " | 100 | " | — | — | " | " | " | 21.9 | " |
| PD 70 | " | " | " | " | " | " | " | 140 | 1 | " | " | — | — | " | " | " | 22.3 | " |
| PD 91 | 49 | HP(250)·RD(80) | 80 | 2 | 50 | 160 | 60 | none | — | 50 | 1 | — | — | 300 | <0.01 | 300 | 8.8 | NO |
| PD 72 | " | " | " | " | " | " | " | " | " | 80 | " | — | — | " | " | " | 17.0 | " |
| PD 73 | " | " | " | " | " | " | " | " | " | 100 | " | — | — | " | " | " | 10.9 | " |
| PD 42 | 55 | HP(250)·D(40) | 40 | 3.4 | 50 | 156 | 81 | none | — | 50 | 1 | — | — | 300 | <0.01 | 300 | 14.5 | NO |
| PD 39 | " | " | " | " | " | " | " | " | " | 80 | " | — | — | " | " | " | 17.6 | NO |
| PD 40 | " | " | " | " | " | " | " | " | " | 100 | " | — | — | " | 0.02 | " | 28.4 | " |
| PD 57 | " | ME·RD(85) | 85 | 2 | " | 155 | 82 | 140 | 1 | 80 | " | — | — | 200 | 0.03 | 200 | 25.5 | " |
| CD 142 | 66 | SC·VD | 80 | 6.3 | 25 | — | — | 140 | 1 | 80 | 1 | — | — | 400 | 0.188 | 370 | 9.6 | YES |
| PUD 283 | " | HP(270)·IWC | none | — | 100 | 150 | 95 | 141 | " | 100 | " | — | — | 329 | 0.181 | — | — | " |
| PUD 281 | " | HP(280)·AC | " | " | 103 | " | " | 140 | " | " | " | — | — | 340 | −.174 | — | — | " |
| CUD 153 | " | SC·VD | " | " | 46 | — | — | 140 | " | 80 | " | — | — | 362 | 0.06 | — | — | " |

Note: <0.01 means less than 0.01.

TABLE 9

| I | II | III | IV A | IV B | V | VI A | VI B | VII A | VII B | VIII A | VIII B | IX A | IX B | X A | X B | XI A | XI B | XII |
|---|---|---|---|---|---|---|---|---|---|---|---|---|---|---|---|---|---|---|
| PD 191 | 72 | HP(290)·IWC | 80 | 7 | 35 | 148 | (123) | 140 | 1 | 100 | 1 | 149 | 117 | 314 | 0.201 | 314 | 12.6 | YES |
| PD 192 | " | HP(240)·IWC | " | 5.8 | 53 | " | " | — | " | 140 | " | " | " | 255 | 0.204 | 228 | 14.1 | YES |
| CUD 197 | " | SC·VD | none | — | 69 | 147 | (105) | 140 | 1 | 100 | " | 147 | " | 348 | 0.170 | 234 | 5.7 | YES |
| CD 199 | " | " | 70 | 5.7 | 43 | 148 | (109) | " | " | " | " | 149 | 118 | 349 | 0.184 | 300 | 11.7 | YES |
| CD 203 | " | " | 83 | 5.6 | 47 | " | 109 | " | " | 80 | " | — | — | 426 | 0.289 | 426 | " | YES |
| PUD 233 | " | HP(290)·IWC | none | — | 80 | " | 122 | " | " | 100 | " | — | — | 423 | 0.259 | — | — | YES |
| PUD 278 | " | HP(270)·AC | " | " | 87 | 151 | 115 | " | " | 130 | " | — | — | 230 | 0.184 | — | — | YES |
| PUD 280 | " | " | " | " | 84 | " | " | " | " | 100 | " | — | — | 536 | 0.204 | — | — | YES |
| PD 221 | 74 | HP(270)·IWC | 80 | 5.6 | 45 | 148 | 128 | 140 | " | 100 | 0.5 | — | — | 333 | 0.258 | — | — | YES |
| PD 236 | " | " | " | " | " | — | — | " | " | 60 | 1 | — | — | 462 | 0.290 | 474 | 7.3 | YES |
| PD 222 | " | HP(270)·WC(40) | " | 5.0 | " | — | — | " | " | 100 | " | — | — | 321 | 0.238 | — | — | YES |
| PD 237 | " | " | " | " | " | — | — | " | " | 60 | " | — | — | 432 | 0.269 | 373 | 9.5 | YES |
| PD 226 | " | HP(270)·WC(60) | " | 4.8 | 51 | — | — | " | 2 | 100 | " | — | — | 333 | 0.224 | — | — | YES |
| PD 227 | " | " | " | " | 58 | — | — | " | " | 60 | " | — | — | 414 | 0.240 | 436 | 10.5 | YES |
| PD 230 | " | " | " | 4.6 | 60 | — | — | " | 1 | 100 | " | — | — | 310 | 0.266 | 295 | 13.9 | YES |
| PD 245 | " | HP(270)·WC(78) | " | 5.0 | 65 | — | — | " | " | " | " | — | — | 369 | 0.245 | — | — | YES |
| PUD 292 | " | HP(270)·AC | none | — | 80 | 150 | 122 | 141 | " | " | 0.5 | — | — | 563 | 0.219 | — | — | YES |
| PUD 229 | " | HP(270)·IWC | none | " | 79 | — | — | 140 | " | " | 1 | — | — | 380 | 0.234 | 306 | 8.3 | YES |
| PUD 250 | " | HP(270)·WC(40) | " | " | 83 | — | — | " | " | " | " | — | — | 422 | 0.291 | — | — | YES |

TABLE 10

| I | II | III | IV A | IV B | V | VI A | VI B | VII A | VII B | VIII A | VIII B | IX A | IX B | X A | X B | XI A | XI B | XII |
|---|---|---|---|---|---|---|---|---|---|---|---|---|---|---|---|---|---|---|
| PUD 251 | 74 | HP(270)·WC(60) | none | — | 78 | — | — | 140 | 1 | 100 | 1 | — | — | 437 | 0.276 | — | — | YES |
| CD 238 | " | SC·VD | 83 | 4.9 | 82 | — | — | " | " | 60 | " | — | — | 427 | 0.278 | — | — | YES |
| CD 244 | " | " | " | " | 100 | — | — | " | " | 100 | " | — | — | 350 | 0.255 | — | — | YES |
| CUD 240 | " | " | none | — | 80 | — | — | " | " | " | " | — | — | 375 | 0.144 | — | — | YES |
| FUD 255 | " | ME(260)·DWC(20) | 20 | D | 44 | — | — | " | " | " | " | — | — | 500 | 0.291 | 489 | 11.0 | YES |
| FUD 268 | " | " | " | " | 30 | — | — | " | " | " | " | — | — | " | 0.311 | 441 | 11.4 | YES |
| FUD 266 | " | " | " | " | 58 | — | — | " | " | 20 | 0.5 | — | — | 621 | 0.212 | — | — | YES |
| FD 263 | " | " | 80 | 4.4 | 40 | — | — | " | " | 100 | 1 | — | — | 300 | 0.171 | — | — | YES |
| DUD 97 | 75 | ME(210)·DAC | — | D | 35 | 148 | 130 | 140 | 1 | 60 | 1 | — | — | 171 | 0.126 | 177 | 5.5 | YES |
| DUD 94 | " | " | " | " | 43 | " | " | " | " | " | " | — | — | 333 | 0.193 | 222 | 8.4 | YES |
| DUD 93 | " | " | " | " | 44 | " | " | " | " | " | " | — | — | 364 | 0.258 | 533 | 7.1 | YES |
| DUD 95 | " | " | " | " | 38 | " | " | " | " | " | " | — | — | 474 | 0.301 | 514 | 9.8 | YES |
| DUD 99 | " | " | " | " | 36 | " | " | " | " | 20 | " | — | — | 528 | 0.281 | 543 | 9.3 | YES |
| DUD 48 | " | " | " | " | 34 | " | " | " | " | 130 | " | — | — | 382 | 0.285 | 394 | 12.5 | YES |
| PD 47 | " | HP(250)·AC | 70 | 2.5 | 50 | " | " | none | — | " | " | — | — | 200 | 0.104 | 200 | 9.2 | YES |
| CUD 109 | " | SC·VD | none | — | 51 | — | — | 140 | 1 | 120 | " | — | — | 275 | 0.196 | 275 | 7.5 | YES |

TABLE 11

| I | II | III | IV A | IV B | V | VI A | VI B | VII A | VII B | VIII A | VIII B | IX A | IX B | X A | X B | XI A | XI B | XII |
|---|---|---|---|---|---|---|---|---|---|---|---|---|---|---|---|---|---|---|
| FD 124 | 79 | ME(290)·DC(65) | 125 | 2.5 | 72 | 145 | none | 143 | 1 | 140 | 1 | 148 | 134 | 417 | 0.151 | 429 | 12.8 | YES |
| PD 127 | " | HP(240)·IWC | 80 | 3.9 | 47 | 147 | 129 | 140 | " | 120 | " | — | — | 319 | 0.196 | 208 | 8.4 | YES |
| PD 135 | " | " | " | " | 50 | " | " | 142 | " | 100 | " | — | — | 360 | 0.230 | 333 | 12.5 | YES |

TABLE 11-continued

| I | II | III | IV A | IV B | V | VI A | VI B | VII A | VII B | VIII A | VIII B | IX A | IX B | X A | X B | XI A | XI B | XII |
|---|----|-----|------|------|---|------|------|-------|-------|--------|--------|------|------|-----|-----|------|------|-----|
| PUD 282 | " | HP(260)·WC(40) | none | — | 75 | 143 | none | 143 | " | 100 | 0.5 | 147 | 139 | 467 | 0.159 | — | — | YES |
| PUD 287 | " | HP(270)·AC | none | " | 61 | 149 | 135 | 141 | " | " | " | — | — | 748 | 0.241 | — | — | YES |
| CD 131 | " | SC·VD | 80 | 4.5 | 28 | 148 | (128) | 143 | " | 80 | 1 | 149 | 139 | 393 | 0.278 | 367 | 7.2 | YES |
| CD 132 | " | " | " | " | 29 | " | " | " | " | 65 | " | " | " | 483 | 0.271 | — | — | YES |
| CD 149 | " | " | 100 | 5.9 | 30 | — | — | 140 | " | 100 | " | — | — | 333 | 0.241 | 333 | 9.6 | YES |
| CUD 128 | " | " | none | — | 81 | 144 | 122 | " | " | " | " | — | — | 284 | 0.193 | 250 | 7.2 | YES |
| CUD 177 | " | " | " | " | 95 | " | " | " | " | " | " | — | — | 326 | 0.254 | 337 | 8.2 | YES |
| CUD 216 | " | " | " | " | 66 | " | " | 130 | " | " | " | — | — | 348 | 0.182 | 338 | 7.3 | YES |
| UD 218 | " | " | " | " | " | " | " | 110 | " | " | " | — | — | 343 | <0.01 | 348 | 6.2 | NO |
| CUD 215 | " | " | 80 | 5 | 36 | 148 | 128 | 140 | " | " | " | — | — | 351 | 0.310 | 361 | 9.7 | YES |
| PUD 290 | " | HP(250)·AC(140) | none | — | 70 | — | — | 140 | — | 100 | 0.5 | — | — | 643 | 0.248 | — | — | YES |

Note: <0.01 means less than 0.01.

TABLE 12

| I | II | III | IV A | IV B | V | VI A | VI B | VII A | VII B | VIII A | VIII B | IX A | IX B | X A | X B | XI A | XI B | XII |
|---|----|-----|------|------|---|------|------|-------|-------|--------|--------|------|------|-----|-----|------|------|-----|
| CD 144 | 80 | SC·VD | 80 | 5.1 | 31 | — | — | 144 | 1 | 100 | 1 | — | — | 387 | 0.060 | 387 | 12.5 | YES |
| CUD 146 | " | " | none | — | 151 | — | — | 140 | " | " | " | — | — | 185 | 0.092 | 167 | 5.2 | YES |
| CUD 294 | " | " | " | " | 60 | — | — | 142 | " | " | " | — | — | 495 | 0.151 | — | — | YES |
| CUD 147 | 82 | SC·VD | none | — | 67 | — | — | 140 | 1 | 100 | 1 | — | — | 441 | 0.060 | 385 | 3.5 | YES |
| PUD 288 | " | HP(288)·AC | none | " | 66 | 151 | 123 | 150 | " | " | " | — | — | 530 | 0.05 | — | — | YES |
| PD 62 | " | HP(250)·RD(120) | 120 | 3 | 91 | 166 | none | 140 | " | 115 | 1 | 162 | 149 | 440 | 0.161 | 400 | 6.7 | YES |
| CP 277 | 72/79 | SC·VD | 83 | 5.8 | 44 | 148 | (117) | 140 | 1 | 100 | 0.5 | 149 | 128 | 500 | 0.285 | — | — | YES |
| CUD 276 | " | " | none | — | 113 | 145 | (113) | " | " | " | " | " | 126 | 354 | 0.189 | — | — | YES |

What is claimed:

1. A piezoelectric, polymeric material consisting essentially of a copolymer consisting essentially of 65 to 82 mole percent of vinylidene fluoride and 38 to 18 mole percent of ethylene trifluoride, and having a thickness extensional electromechanical coupling factor ($K_t$) of between about 0.05 and about 0.31.

2. A piezoelectric polymeric material as claimed in claim 1 in which the thickness extensional electromechanical coupling factor ($K_t$) is greater than 0.1.

3. A piezoelectric polymeric material as claimed in claim 1 in which the thickness extensional electromechanical coupling factor ($K_t$) is greater than about 0.2.

4. A piezoelectric polymeric material as claimed in claim 1 in which the copolymer consists essentially of 70 to 82 mole percent of vinylidene fluoride and 30 to 18 mole percent of ethylene trifluoride.

5. A process for producing a piezoelectric polymeric material which consists essentially of a copolymer consisting essentially of vinylidene fluoride and ethylene trifluoride, said process comprising heat-treating a polymeric material consisting essentially of a copolymer consisting essentially of 65 to 82 mole percent of vinylidene fluoride and 35 to 18 mole percent of ethylene trifluoride at a heat-treating temperature T(°C.) being in the range of from the temperature of 5(°C.) below the crystal phase transition temperature T'm(°C.) to the melting point temperature Tm(°C.) and then poling the heat-treated polymeric material to achieve a thickness extensional electromechanical coupling factor ($K_t$) of between about 0.05 and about 0.31.

6. A process for producing a piezoelectric polymeric material as claimed in claim 5 in which the heat-treating temperature T(°C.) is in the range of from T'm(°C.) to Tm(°C.).

7. A process for producing a piezoelectric polymeric material as claimed in claim 5 in which the copolymer consists essentially of 70 to 82 mole percent of vinylidene fluoride and 30 to 18 mole percent of ethylene trifluoride.

8. A process for producing a piezoelectric polymeric material which consists essentially of a copolymer consisting essentially of vinylidene fluoride and ethylene trifluoride which process comprises heat-treating a polymeric material consisting essentially of a copolymer consisting essentially of 65 to 82 mole percent of vinylidene fluoride and 35 to 18 mole percent ethylene trifluoride at a heat-treating temperature T(°C.) being in the range of from the temperature of 5(°C.) below the crystal phase transition temperature T'm(°C.) to the melting point temperature Tm(°C.) while poling the polymeric material to achieve a value of the thickness extensional electromechanical coupling factor ($K_t$) of between about 0.05 and about 0.31.

9. A process for producing a piezoelectric polymeric material as claimed in claim 8 in which the heat-treating temperature T(°C.) is in the range of from T'm(°C.) to Tm(°C.).

10. A process for producing a piezoelectric polymeric material as claimed in claim 8 in which the copolymer consists essentially of 70 to 82 mole percent of vinylidene fluoride and 30 to 18 mole percent of ethylene trifluoride.

11. A process for producing a film having piezoelectric properties comprising the steps of:
  (I.) providing a film of a random copolymer consisting essentially of 65 to 82 mole percent vinylidene fluoride, balance essentially ethylene trifluoride, having a given melting point Tm(°C.), and having a given crystal phase transition temperature T'm(°C.); and then
  (II.) heating the film to a temperature greater than about T'm but less than Tm for 10 minutes to 2 hours to produce a heat-treated film; and then
  (III.) poling the heat-treated film in an electrical field of about 50 to 1500 kV/cm at a temperature of at least 25° C. for a time of from about 1 minute to about 2 hours but sufficient to give the film a thickness extensional electromechanical coupling factor ($K_t$) of between about 0.05 and 0.31.

* * * * *